United States Patent
Aida et al.

(10) Patent No.: US 10,958,073 B2
(45) Date of Patent: Mar. 23, 2021

(54) REACTIVE POWER CONTROL EQUIPMENT AND REACTIVE POWER CONTROL METHOD

(71) Applicant: Mitsubishi Power, Ltd., Yokohama (JP)

(72) Inventors: Yuuki Aida, Yokohama (JP); Yasuto Tahara, Yokohama (JP); Kenichi Sudo, Yokohama (JP)

(73) Assignee: Mitsubishi Power, Ltd., Yokohama (JP)

( * ) Notice: Subject to any disclaimer, the term of this patent is extended or adjusted under 35 U.S.C. 154(b) by 0 days.

(21) Appl. No.: 16/542,611

(22) Filed: Aug. 16, 2019

(65) Prior Publication Data
US 2020/0144820 A1    May 7, 2020

(30) Foreign Application Priority Data
Nov. 7, 2018 (JP) .............................. JP2018-209646

(51) Int. Cl.
  *H02J 3/16* (2006.01)
  *G01R 21/00* (2006.01)
  *G05F 1/66* (2006.01)

(52) U.S. Cl.
  CPC .............. *H02J 3/16* (2013.01); *G01R 21/003* (2013.01); *G05F 1/66* (2013.01)

(58) Field of Classification Search
  CPC .. H02J 3/16; H02J 3/46; H02J 2300/20; H02J 3/381; H02J 3/50; H02J 3/38;
(Continued)

(56) References Cited

U.S. PATENT DOCUMENTS

2014/0288725 A1    9/2014  Itaya
2015/0168981 A1    6/2015  Skliutas et al.
(Continued)

FOREIGN PATENT DOCUMENTS

EP    3 288 142 A1    2/2018
JP    2012-44863 A    3/2012
(Continued)

OTHER PUBLICATIONS

Wikipedia contributors. "Synchronous condenser." Wikipedia, The Free Encyclopedia. Wikipedia, The Free Encyclopedia, Nov. 30, 2020. Web. Nov. 30, 2020. (Year: 2020).*
(Continued)

*Primary Examiner* — Daniel J Cavallari
(74) *Attorney, Agent, or Firm* — Crowell & Moring LLP (57) ABSTRACT

The invention provides reactive power control equipment that controls the reactive power adjusted by a synchronous condenser coupled to an electric power grid and the reactive power of the electric power supplied to the electric power grid, to optimally control the reactive power in each load terminal point (power consumption area), considering instability of the electric power supplied from renewable energy power generation equipment. The above equipment includes an input portion that inputs information of reactive power including reactive power adjusted by an automatic voltage regulator of automatically adjusting a voltage of electric power generated by an electric power generator and supplied to an electric power grid, reactive power adjusted by a synchronous condenser coupled to the electric power grid, reactive power of electric power generated by the renewable energy power generation equipment, and reactive power set in each load terminal point (consumer area) of consuming the electric power; a calculation unit that calculates each setting value of reactive power adjusted by the synchronous
(Continued)

condenser and the automatic voltage regulator, using the information of the reactive power input in the input portion; and an output portion that outputs the setting values of the reactive power calculated by the calculation unit respectively to the synchronous condenser and the automatic voltage regulator.

7 Claims, 4 Drawing Sheets

(58) Field of Classification Search
CPC .... H02J 3/1885; H02J 3/1835; G01R 21/003; G05F 1/66; Y02E 40/30
See application file for complete search history.

(56) References Cited

U.S. PATENT DOCUMENTS

| | | | |
|---|---|---|---|
| 2015/0372491 | A1 | 12/2015 | Spisak et al. |
| 2017/0017298 | A1* | 1/2017 | Biswas ................... G06F 13/36 |
| 2018/0152020 | A1 | 5/2018 | Kuroda et al. |
| 2019/0280481 | A1* | 9/2019 | Kuroda ............. H02J 13/00034 |

FOREIGN PATENT DOCUMENTS

| | | |
|---|---|---|
| JP | 2016-36252 A | 3/2016 |
| JP | 2016-82741 A | 5/2016 |
| JP | 2016-208654 A | 12/2016 |
| JP | 2017-103967 A | 6/2017 |
| JP | 2018-68045 A | 4/2018 |

OTHER PUBLICATIONS

Wikipedia contributors. "Voltage regulator." Wikipedia, The Free Encyclopedia. Wikipedia, The Free Encyclopedia, Nov. 28, 2020. Web. Nov. 30, 2020. (Year: 2020).*

Examination Report issued in Australian Application No. 2019216583 dated May 22, 2020 (six (6) pages).

Extended European Search Report issued in European Application No. 19190818.5 dated Jan. 15, 2020 (eight (8) pages).

Hernandez B. et al., "Secondary and Tertiary Voltage Regulation Controls Based on Regional Optimal Power Flows", 2018 Power Systems Computation Conference (PSCC), Jun. 11, 2018, pp. 1-7, XP033393169 (seven (7) pages).

Hindi-language Office Action issued in Indian Application No. 201914032396 dated Jul. 13, 2020 with English translation (five pages).

Korean-language Office Action issued in Korean Application No. 10-2019-0104827 dated Nov. 16, 2020 with English translation (eight (8) pages).

Canadian Office Action issued in Canadian Application No. 3,051,438 dated Dec. 7, 2020 (3 pages).

* cited by examiner

REACTIVE POWER CONTROL EQUIPMENT AND REACTIVE POWER CONTROL METHOD

CLAIM OF PRIORITY

The present application claims priority from Japanese Patent application serial no. 2018-209646, filed on Nov. 7, 2018, the content of which is hereby incorporated by reference into this application.

TECHNOLOGICAL FIELD

The invention relates to reactive power control equipment and a reactive power control method.

BACKGROUND

These days, with increasing environmental consciousness, renewable energy power generation equipment is increasing at a high speed. The ratio of the power through the renewable energy electric power generation in the whole generated electric power is increasing year by year. The renewable energy electric power generation, however, is unstable in the power supply; for example, photovoltaic power generation is affected by bad weather, and wind power generation is affected by wind speed. Therefore, in the present circumstances, the power generated by the renewable energy power generation equipment is difficult to be completely replaced with the power generated by the base load power generation equipment such as thermal power generation and nuclear power generation.

Accordingly, the power supplied to an electric power grid is a combination of the power generated by the renewable energy power generation equipment and the power generated by the thermal power plant and the nuclear power equipment.

The ratio of the power generated by the renewable energy power generation equipment tends to increase. Since one electric power grid includes the combined power generated by the renewable energy power generation equipment and generated by the thermal power plant and the nuclear power equipment, the voltage and frequency of the electric power shows unpredictable behavior in each load terminal point (power consumption area) coupled to the electric power grid, and it is difficult to optimally control the voltage and frequency in each load terminal point (power consumption area).

As the background art of this technical field, there is Japanese Unexamined Patent Application Publication No. 2016-208654. This publication discloses electric power grid voltage and reactive power monitoring, and control equipment that gives control data to the respective equipment capable of adjusting the voltage and the reactive power of the electric power grid. The above equipment requires one and more allowable band width of targeted value, using one and more indexes of showing stability of the electric power grid, obtains the information about the targeted value from the allowable band width of targeted value, and gives the control data including the information about the targeted value to the respective equipment, so that the respective equipment adjusts the voltage and the reactive power in each setting place (refer to Abstract).

SUMMARY OF THE INVENTION

Japanese Unexamined Patent Application Publication No. 2016-208654 discloses the electric power grid voltage reactive power monitoring and control equipment that keeps balance between the voltage and the reactive power of an electric power grid. The above equipment in the above publication, however, does not challenge to control the reactive power adjusted by a synchronous condenser coupled to the electric power grid and the reactive power of the electric power coupled to the electric power grid and to optimally control the reactive power of the electric power in each load terminal point (power consumption area), considering instability of the electric power supplied from the renewable energy power generation equipment.

The invention provides reactive power control equipment and a reactive power control method of controlling the reactive power adjusted by a synchronous condenser coupled to the electric power grid and the reactive power of the electric power supplied to the electric power grid, to optimally control the reactive power in each load terminal point (power consumption area), considering the instability of the electric power supplied from the renewable energy power generation equipment.

The reactive power control equipment described in the invention includes an input portion that inputs the information of reactive power including the reactive power adjusted by an automatic voltage regulator of automatically adjusting a voltage of electric power generated by an electric power generator and supplied to an electric power grid, reactive power adjusted by a synchronous condenser coupled to the electric power grid, the reactive power of electric power generated by the renewable energy power generation equipment, and reactive power set in each load terminal point (consumer area) of consuming the electric power; a calculation unit that calculates each setting value of the reactive power adjusted by the synchronous condenser and the automatic voltage regulator, using the information of the reactive power input in the input portion; and an output portion that outputs the setting values of the reactive power calculated by the calculation unit respectively to the synchronous condensers and the automatic voltage regulators.

Further, the reactive power control method described in the invention includes the following steps of: inputting information of the reactive power including reactive power adjusted by an automatic voltage regulator of automatically adjusting a voltage of electric power generated by an electric power generator and supplied to the electric power grid, reactive power adjusted by a synchronous condenser coupled to the electric power grid, reactive power of electric power generated by the renewable energy power generation equipment, and reactive power set in each load terminal point (power consumption area) of consuming the electric power; calculating each setting value of the reactive power adjusted by the synchronous condenser and the automatic voltage regulator, using the input reactive power information; and outputting the calculated setting values of the reactive power respectively to the synchronous condensers and the automatic voltage regulators.

The invention is to provide the reactive power control equipment and the reactive power control method of controlling the reactive power adjusted by the synchronous condenser coupled to the electric power grid and the reactive power of the electric power supplied to the electric power grid, to optimally control the reactive power in each load terminal point (power consumption area), considering the instability of the electric power supplied from the renewable energy power generation equipment.

Other objects, structures, and effects than the above will be cleared according to the description of the following embodiment.

DETAILED DESCRIPTION OF EMBODIMENTS

Hereinafter, a preferred embodiment will be described with reference to the drawings. The same reference numerals are attached to the same components and the description is saved when there is an overlapping description.

Embodiment

Figure 1:
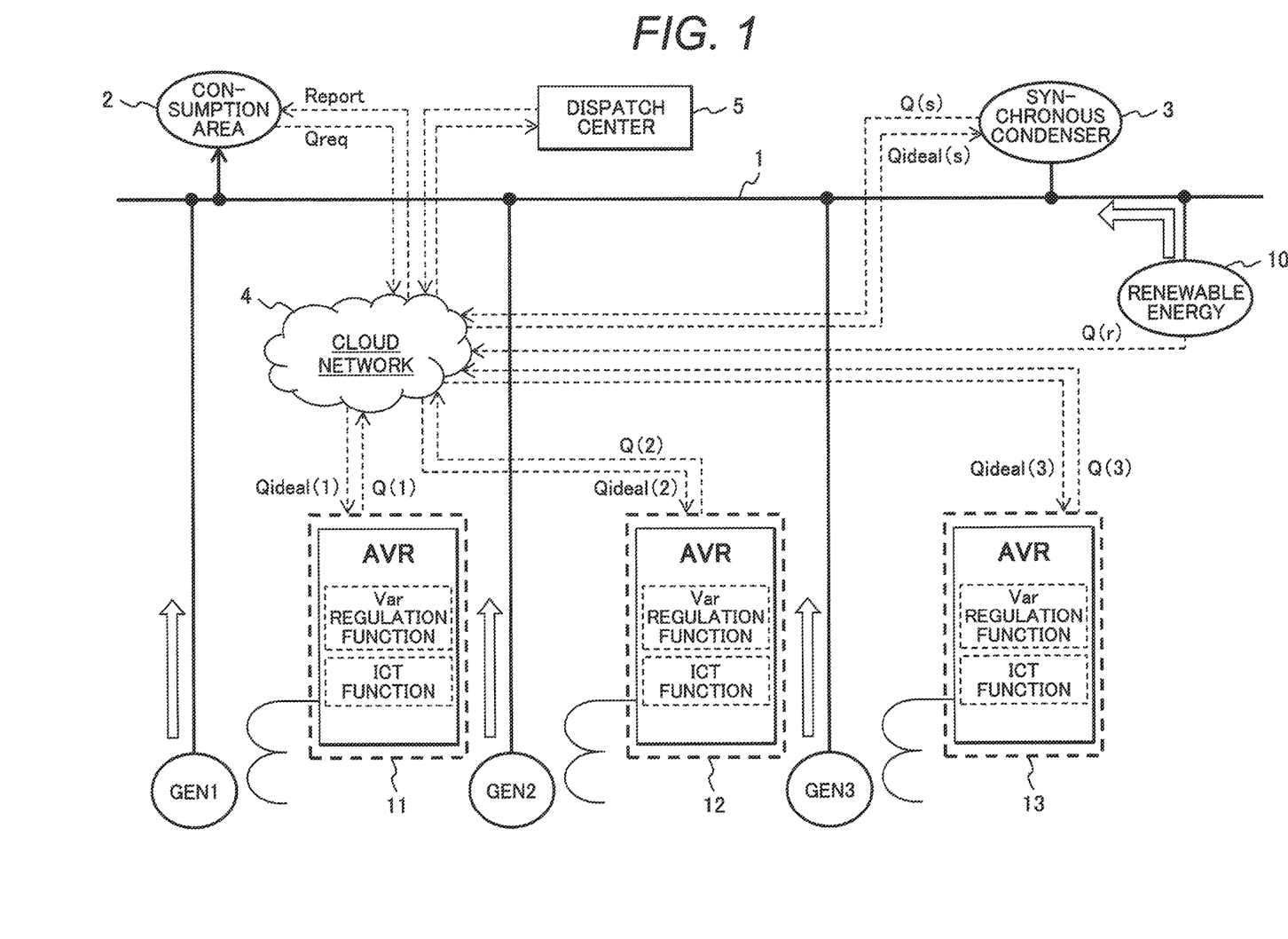
FIG. 1 is an explanatory view for describing respective power generation equipment coupled to an electric power grid according to the embodiment.

FIG. 1 is an explanatory view for describing respective power generation equipment coupled to an electric power grid in the embodiment.

Electric powers generated by electric power generators (GEN1, GEN2, and GEN3) are supplied to an electric power grid 1. These electric power generators (GEN1, GEN2, and GEN3) are installed in power generation equipment (station) built in respective regions (respective areas). For example, the electric power generators are installed in the thermal power generation equipment and the nuclear power generation equipment. Further, these electric power generators (GEN1, GEN2, and GEN3) are installed in the power generation equipment (station) built in one region (one area). For example, the electric power generators are installed in one piece of power generation equipment in a multiple (multi-shaft) way.

The electric power generated by renewable energy power generation equipment 10 is supplied to the electric power grid 1. The renewable energy power generation equipment 10 is, for example, the photovoltaic power generation equipment and the wind power generation equipment.

As mentioned above, in the embodiment, the respective power generation equipment is coupled to the electric power grid 1, where there is the mixed electric power generated by the renewable energy power generation equipment 10 and generated by the electric power generators (GEN1, GEN2, and GEN3) installed in the thermal power generating plant and the nuclear power generation equipment.

Further, respective load terminal points (hereinafter, described as "power consumption area") 2 which consume the electric power supplied from the electric power grid 1 are coupled to the electric power grid 1.

As the result, particularly because of instability of the electric power generated by the renewable energy power generation equipment 10, there is a possibility that a request reactive power value to be requested by the power consumption area 2 cannot be set properly, as for the electric power supplied from the electric power grid 1 including a mixture of the electric power generated by the renewable energy power generation equipment 10 and the electric power generated by the electric power generators (GEN1, GEN2, and GEN3) installed in the thermal power generating plants and the nuclear power generation equipment.

The electric power generators (GEN1, GEN2, and GEN3) respectively include AVRs (AVR: Automatic Voltage Regulator; hereinafter, described as "AVR") (AVR11, AVR12, and AVR13).

The AVR11 (although AVR11 will be typically described, AVR12 and AVR13 have the same function) described in the embodiment is to automatically adjust the voltage of the electric power generated by the electric power generator GEN1 (although this description will be made by using the GEN1 corresponding to the AVR11, the same applies to the GEN2 corresponding to the AVR12 and the GEN3 corresponding to the AVR13) to a predetermined value. In short, the AVR11 is to automatically adjust the voltage of the electric power supplied to the electric power grid 1. The AVR12 and the AVR13 are the same. In the embodiment, although the case of having three electric power generators and three AVRs is described, the number is not restricted to this.

The AVR11 has a function of information and communication technology (ICT: Information and Communication Technology, hereinafter, described as "ICT") and a function of automatic reactive power regulator (AQR: Automatic Q Regulator) (hereinafter, this function will be described as "Var regulation function"). Here, the Var regulation function is a function of automatically adjusting the reactive power of the electric power generated by the electric power generator GEN1 to a predetermined value. The AVR12 and the AVR13 have the same function.

Further, a synchronous condenser 3 is coupled to the electric power grid 1. Here, the synchronous condenser 3 is coupled to the electric power grid 1 in a no-load state, to adjust the reactive power of the electric power grid 1 in this embodiment.

Reactive power control equipment 4 described in the embodiment is coupled to the power consumption area 2, the synchronous condenser 3, the AVR11, the AVR12, the AVR13, the renewable energy power generation equipment 10, and a central load dispatch center (hereinafter, described as "dispatch center") 5, to transmit and receive (input and output) the information of the reactive power to and from the above.

The dispatch center 5 monitors the used amount of the electric power in the power consumption area 2 and the electric generating power generated by the respective electric power generators (GEN1, GEN2, and GEN3) through the respective AVRs (11, 12, 13), and shares various types of information (effective electric power, frequency, voltage, and the like) including the information of the reactive power with the reactive power control equipment 4.

The reactive power control equipment 4 in the embodiment is described using a cloud network (CLOUD NETWORK) capable of automatic analysis and high-speed calculation; however, it is not restricted to this as far as it can gather the information of the reactive power and automatically adjust the fluctuation of the reactive power set in the power consumption area 2.

The reactive power control equipment 4 receives the reactive power Q(1) from the AVR11, the reactive power Q(2) from the AVR12, and the reactive power Q(3) from the AVR13. Each of the reactive power Q(1), the reactive power Q(2), and the reactive power Q(3) is the reactive power of the electric power generated by each of the electric power generator GENT, the electric power generator GEN2, and the electric power generator GEN3.

The reactive power control equipment 4 receives the reactive power Q(r) of the electric power generated by the renewable energy power generation equipment 10 from the renewable energy power generation equipment 10.

The reactive power control equipment 4 receives the reactive power Q(s) adjusted by the synchronous condenser 3 from the synchronous condenser 3.

The reactive power control equipment 4 receives the reactive power Q(req) (request reactive power value) set in the power consumption area 2, or requested by the power consumption area 2, from the power consumption area 2.

The reactive power control equipment 4 described in the embodiment calculates the reactive power Q(ideal) (1) as the setting value, for example, using the reactive power Q(req), the reactive power Q(1), the reactive power Q(s), and the reactive power Q(r) and outputs the reactive power Q(ideal) (1) to the AVR11. Similarly, the above equipment outputs the reactive power Q(ideal) (2) to the AVR12 using the reactive power Q(2) and the like and the reactive power Q(ideal) (3) to the AVR13 using the reactive power Q(3) and the like.

Further, the above outputs the reactive power Q(ideal) (s) as the setting value to the synchronous condenser 3.

Using the input reactive power information, the reactive power control equipment 4 calculates the reactive power (reactive power Q(ideal) (1) and the reactive power Q(ideal) (s)) for the adjustment of the AVR11 and the synchronous condenser 3, and outputs the calculated reactive power (the reactive power Q(ideal) (1) and the reactive power Q(ideal) (s)) to the AVR11 and the synchronous condenser 3. The AVR11 and the synchronous condenser 3 control the reactive power (the reactive power Q(1) and the reactive power Q(s)) output by the AVR11 and the synchronous condenser 3, according to the input reactive power (the reactive power Q(ideal) (1) and the reactive power Q(ideal) (s)). The same ones apply to the AVR12 and the AVR13.

Further, the above equipment reports the reactive power Q(ideal) as the setting value to the power consumption area 2 (Report).

Even in the electric power grid 1 including a mixture of the electric power generated by the renewable energy power generation equipment 10 and the electric power generated by the electric power generators (GENT, GEN2, and GEN3) installed in the thermal power generating plant and the nuclear power generation equipment, the reactive power control equipment 4 described in the embodiment sequentially calculates the reactive power Q(ideal) in real time, for example, using the reactive power Q(1) (the reactive power Q(2) and the reactive power Q(3) are the same), the reactive power Q(s), and the reactive power Q(r), and controls the reactive power (Q(k) and Q(s)) to properly set the reactive power Q(req) requested by the power consumption area 2, in other words, the request reactive power value set in the power consumption area 2. Here, the Q(k) is a general term of Q(1), Q(2), and Q(3).

Figure 2:
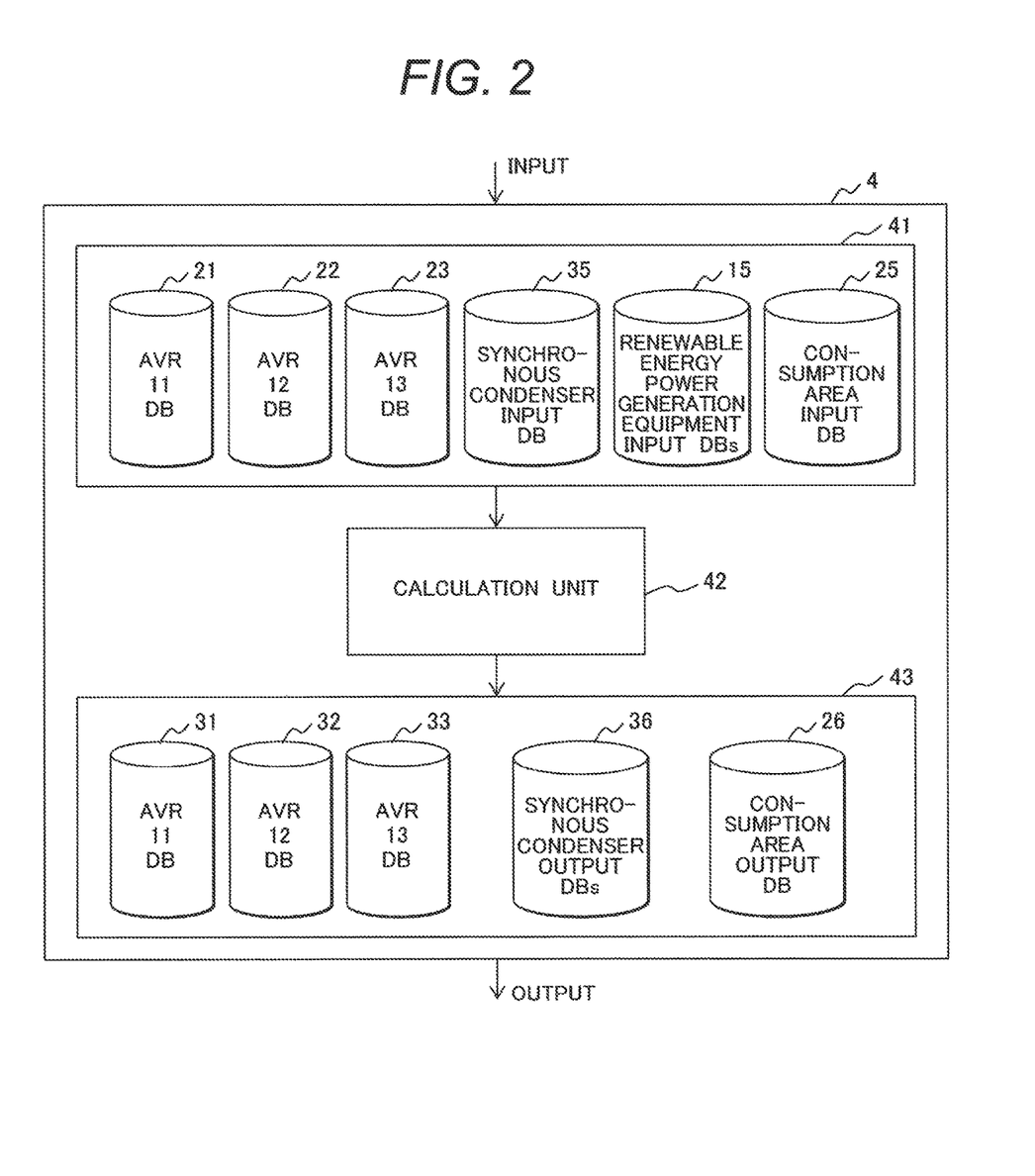
FIG. 2 is an explanatory view for describing a function of controlling the reactive power according to the embodiment.

FIG. 2 is an explanatory view for describing a function of controlling the reactive power in the embodiment.

The reactive power control equipment 4 described in the embodiment includes an input portion database 41 as the input portion, a calculation unit 42, and an output portion database 43 as the output portion. Hereinafter, the database will be described as "DB".

The input portion DB 41 includes a consumption area input DB 25 for storing the reactive power Q(req) input from the power consumption area 2, a synchronous condenser input DB 35 for storing the reactive power Q(s) input from the synchronous condenser 3, an AVR11 input DB 21 for storing the reactive power Q(1) input from the AVR11, an AVR12 input DB 22 for storing the reactive power Q(2) input from the AVR12, an AVR13 input DB 23 for storing the reactive power Q(3) input from the AVR13, and a renewable energy power generation equipment input DB 15 for storing the reactive power Q(r) input from the renewable energy power generation equipment 10.

In other words, the input portion DB 41 is an input portion for receiving the reactive power Q(req), the reactive power Q(s), the reactive power Q(1), the reactive power Q(2), the reactive power Q(3), and the reactive power Q(r), as the information of the reactive power.

The calculation unit 42 calculates the reactive power Q(ideal) (1) as the setting value, for example, using the stored reactive power Q(req), reactive power Q(1), reactive power Q(s), and reactive power Q(r). Similarly, the calculation unit 42 calculates the reactive power Q(ideal) (2), using the reactive power Q(2) and the like, and the reactive power Q(ideal) (3), using the reactive power Q(3) and the like. Further, similarly, the calculation unit 42 calculates the reactive power Q(ideal) (s) as the setting value.

In short, the calculation unit 42 calculates the reactive power Q(ideal) (s) to be adjusted by the synchronous condenser 3 and the reactive power Q(ideal) (1, 2, 3) to be adjusted by the AVR(11, 12, 13), using the input reactive power information.

The calculation unit 42 subtracts a total of, for example, the reactive power Q(1) adjusted by the AVR11 (the reactive power Q(2) adjusted by the AVR12 and the reactive power Q(3) adjusted by the AVR13 are the same), the reactive power Q(s) adjusted by the synchronous condenser 3, and the reactive power Q(r) of the electric power generated by the renewable energy power generation equipment 10, from the reactive power Q(req) set in the power consumption area 2, to calculate a deviation value.

The calculation unit 42 compares this deviation value with predetermined reactive power (Q(gap) described later).

When the deviation value is the predetermined reactive power (Q(gap) described later) and more, the calculation unit 42 determines whether the loop continuous time is greater than the predetermined time or not.

When the loop duration time reaches the predetermined time and more, the calculation unit 42 slightly adjusts the predetermined reactive power (Q(gap) described later) to shorten the loop continuous time.

The output portion DB 43 includes an AVR11 output DB 31, an AVR12 output DB 32, an AVR13 output DB 33, a consumption area output DB 26, and a synchronous condenser output DB 36. The output portion DB 43 stores the calculated reactive power Q(ideal) (1) in the AVR11 output DB 31, reactive power Q(ideal) (2) in the AVR12 output DB 32, reactive power Q(ideal) (3) in the AVR13 output DB 33, reactive power Q(ideal) in the consumption area output DB 26, and reactive power Q(ideal) (s) in the synchronous condenser output DB 36, and outputs the calculation results to the AVR11, the AVR12, the AVR13, and the synchronous condenser 3.

The AVR11, the AVR12, the AVR13, and the synchronous condenser 3 control the reactive power (the reactive power Q(1), the reactive power Q(2), the reactive power Q(3), and the reactive power Q(s)) output by the AVR11, the AVR12, the AVR13, and the synchronous condenser 3, based on the output calculation results (the reactive power Q(ideal) (1), the reactive power Q(ideal) (2), the reactive power Q(ideal) (3), and the reactive power Q(ideal) (s)).

In short, the output portion DB 43 is an output portion of outputting the reactive power calculated by the calculation unit 42 (the reactive power Q(ideal) (1), the reactive power Q(ideal) (2), the reactive power Q(ideal) (3), and the reactive power Q(ideal) (s)) to the AVR11, the AVR12, the AVR13, and the synchronous condenser 3.

Further, the output portion DB 43 reports the reactive power Q(ideal) as the setting value to the power consumption area 2 (Report).

According to this, even in the electric power grid 1 including a mixture of the electric power generated by the renewable energy power generation equipment 10 and the electric power generated by the electric power generators (GEN1, GEN2, and GEN3) installed in the thermal power generating plant and the nuclear power generation equipment, it is possible to stably control the reactive power Q(req) to satisfy the reactive power Q(req) requested by the power consumption area 2, in other words, the request reactive power value set in power consumption area 2, for example, using the reactive power Q(1) (the reactive power Q(2) and the reactive power Q(3) are the same), the reactive power Q(s), and the reactive power Q(r), by sequentially calculating the reactive power Q(ideal) in real time.

Then, a reactive power control method described in the embodiment includes a process of inputting the reactive power Q(1) (the reactive power Q(2) and the reactive power Q(3) are the same), the reactive power Q(s), the reactive power Q(r), and the reactive power Q(req) as the reactive power information, a process of calculating the reactive power (the reactive power Q(ideal) (1), the reactive power Q(ideal) (2), the reactive power Q(ideal) (3), and the reactive power Q(ideal) (s)) adjusted by the AVR(11, 12, 13) and the synchronous condenser 3, using the input reactive power information, and a process of outputting the calculated reactive power (the reactive power Q(ideal) (1), the reactive power Q(ideal) (2), the reactive power Q(ideal) (3), and the reactive power Q(ideal) (s)) to the AVR(11, 12, 13) and the synchronous condenser 3.

The reactive power control equipment 4 has an ICT function, which enables centralized supervision and centralized control. Further, the above has a function of sequentially controlling the reactive power and a function of centralizing the reactive power information in real time. Even when the electric power grid 1 contains the unsteadily-fluctuating renewable energy power generation equipment 10, it is possible to sequentially solve the unpredictable behavior of the reactive power in the power consumption area 2 and properly control the reactive power in real time.

Further, the AVR described in the embodiment has the ICT function and a Var regulation function, which enables data communication and data cooperation, and further, can sequentially adjust the reactive power in real time. Especially, the AVR has a function of automatically and sequentially receiving (inputting) the reactive power calculated by the reactive power control equipment 4, in real time, as a feedback instruction, until the reactive power in the power consumption area 2 becomes proper. Further, the Var regulation function is centralized in the AVR, hence saving space in the installation area at the site can be expected.

The embodiment enables the centralized supervision and the centralized control of the reactive power of the power generation equipment affecting the power consumption area 2, according to the reactive power control equipment 4. The unsteadily-fluctuating renewable energy power generation equipment 10, the AVR, and the synchronous condenser 3 are cooperatively operated through the reactive power control equipment 4, so that the same equipment 4 receives (collects, inputs) the reactive power information in real time from the renewable energy power generation equipment 10, the AVR, and the synchronous condenser 3. The reactive power is sequentially controlled in the AVR and the synchronous condenser 3.

Even in the electric power grid 1 increasing more and more in the ratio of the electric generating capacity of the renewable energy power generation equipment 10, it is possible to realize stable control of the reactive power Q(req) (request reactive power value) requested by the power consumption area 2 or set in the power consumption area 2.

Figure 3:
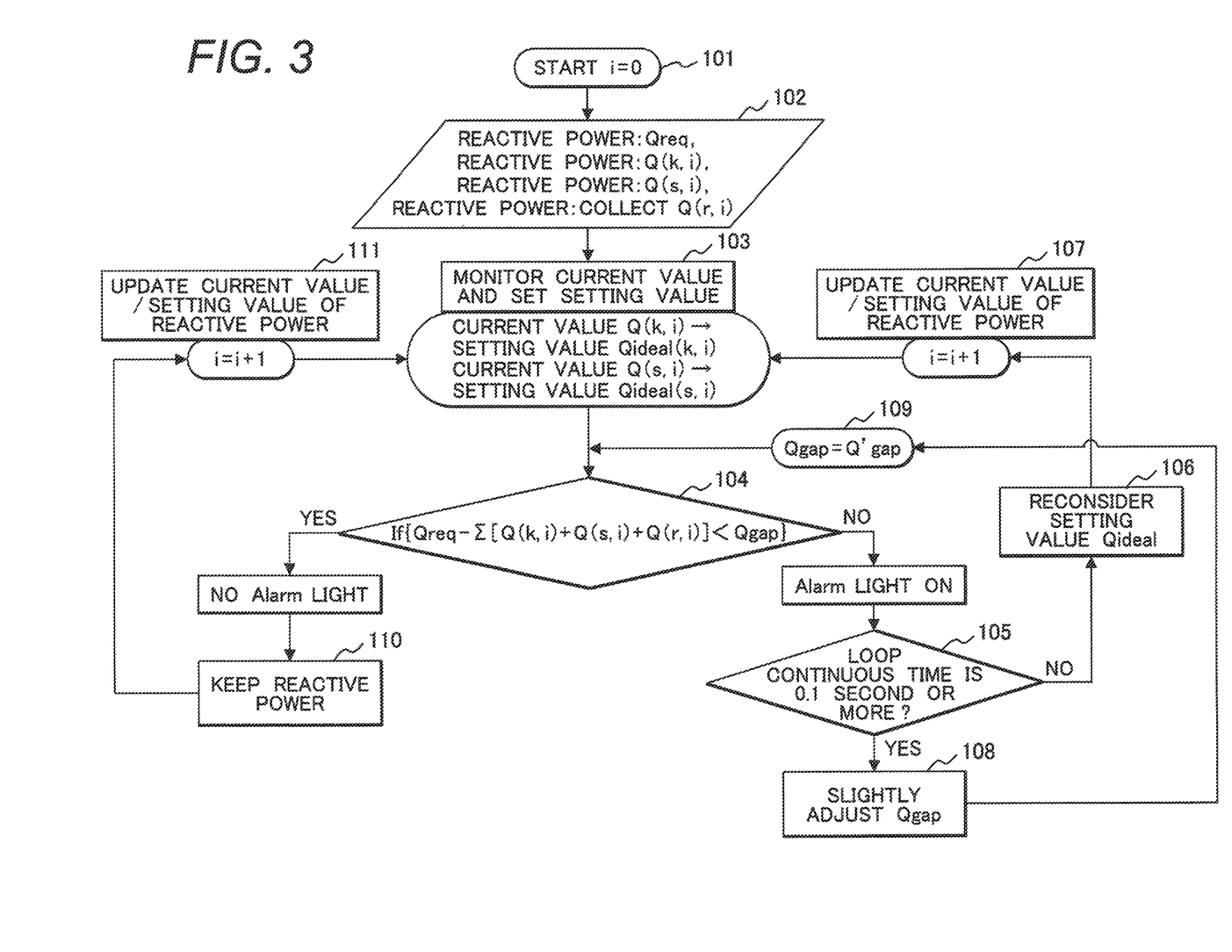
FIG. 3 is an explanatory view for describing a flow chart of controlling the reactive power according to the embodiment.

FIG. 3 is an explanatory view for describing a flow chart for controlling the reactive power in the embodiment.

The reactive power control equipment 4 receives (collects and inputs) the reactive power Q automatically and continuously (sequentially and in real time) in the input portion, calculates the above in the calculation unit 42, and transmits (outputs) the calculation result in the output portion.

The reactive power control method includes a process of inputting (collecting and receiving) the reactive power Q automatically and continuously (sequentially and in real time) in the input portion, a process of calculating the reactive power Q in the calculation unit 42, and a process of outputting (transmitting) the calculation result in the output portion.

Particularly, the calculation unit 42 performs the following processing (calculating process).

At first, the processing starts with the repetition number (i) of calculation loop, or the loop number i=0 (101).

Then, various types of reactive power Q are input (102). Specifically, the reactive power Q(1) is input from the AVR11, the reactive power Q(2) is input from the AVR12, and the reactive power Q(3) is input from the AVR13. Here, the reactive power Q from the AVR(k) with the loop number i is represented as reactive power Q(k, i). For example, the reactive power Q from the AVR11 of the loop number (first) is represented as the reactive power Q(11, 1).

The reactive power Q(r) is input from the renewable energy power generation equipment 10. Here, the reactive power Q from the renewable energy power generation equipment 10 with the loop number i is represented as the reactive power Q(r, i).

The reactive power Q(s) is input from the synchronous condenser 3. Here, the reactive power Q from the synchronous condenser 3 with the loop number i is represented as the reactive power Q(s, i).

The reactive power Q(req) (request reactive power value) is input from the power consumption area 2.

Next, a process of monitoring the current value of the reactive power Q and setting the setting value (operation pattern) is performed (103). Particularly, in the embodiment, the above is performed on the reactive power Q(k, i) and the reactive power Q(s, i). In other words, the reactive power Q(k, i) and the reactive power Q(s, i) are set as the reactive power Q(ideal) (k, i) and the reactive power Q(ideal) (s, i) calculated in the reactive power control equipment 4. In the case of the loop number i=0, the reactive power Q(k, 0) and the reactive power Q(s, 0) are set as the initial value.

The reactive power Q(k, i) as the current value can be monitored sequentially and in real time, and the reactive power Q(ideal) (k, i) and the reactive power Q(ideal) (s, i) as the setting value are set after examining the fluctuation factor comprehensively. The fluctuation factor includes, for example, fluctuation of the electric generating power in the renewable energy power generation equipment 10 with the form of the electric power generation (photovoltaic power generation and wind power generation) and regionality taken into consideration, a change of the operation pattern in the power consumption area 2, and stability of the electric power grid 1 depending on the running number and the installation number of the electric power generators (GEN1, GEN2, and GEN3) and the synchronous condenser 3.

Next, it is determined whether or not a deviation value of the reactive power Q(req) (request reactive power value) from the total of the reactive power Q(k, i), the reactive power Q(s, i), and the reactive power Q(r, i) is within a predetermined values (reactive power Q(gap)) (104). The reactive power Q(gap) is a desired deviation of the reactive power and the initial setting value of the reactive power Q(gap) is set based on the major conditional plan described later (accumulated data in the past). This reactive power Q(gap) (reactive power desired deviation) can be changed between daytime and nighttime.

Specifically, the relation of (1) If{Q(req)−[Q(k, i)+Q(s, i)+Q(r, i)]<Q(gap)} is determined. When there are plural Q(k, i)+Q(s, i)+Q(r, i), these are added.

In the calculating process, the reactive power of adding Q(k, i), Q(s, i), and Q(r, i) is subtracted from the Q(req) to calculate a deviation value.

Further, in the calculating process, this deviation value is compared with the Q(gap) (predetermined reactive power deviation).

When the relational expression (1) is satisfied, in other words, when the left side is less than the Q(gap), the reactive power Q is determined to be proper (no Alarm light on).

When the relational expression (1) is not satisfied, in other words, when the left side is Q(gap) and more, the reactive power Q is determined to be improper (Alarm light on).

Here, the reactive power Q(gap) can be adjusted in the calculation unit 42 of the reactive power control equipment 4.

Next, when the relational expression (1) is satisfied, in other words, when the left side is less than Q(gap), the reactive power Q is kept (110).

Then, the loop number i is increased by "1" and the current value and the setting value of the reactive power Q are updated (111).

On the other hand, when the relational expression (1) is not satisfied, in other words, when the left side is Q(gap) and more, it is determined whether or not the loop continuous time is a predetermined time and more. In the embodiment, it is determined, for example, whether or not the loop continuous time is 0.1 second or more (105).

In other words, in the calculating process, when the deviation value is Q(gap) (the predetermined reactive power) and more, it is determined whether or not the loop continuous time is the predetermined time (0.1 second in the embodiment) and more.

The above determination is performed because the electric power becomes instable especially when the renewable energy power generation equipment 10 is coupled to the electric power grid 1; for the electric power generated by the renewable energy power generation equipment 10 is greatly affected by the environment (for example weather etc.) and the fluctuation of the electric power becomes large.

When the loop continuous time is less than 0.1 second, the reactive power Q(ideal) (k, i) and the reactive power Q(ideal) (s, i) as the setting value are reconsidered (106). Here, they are reconsidered also by comprehensively re-examining the fluctuation factor.

Then, the loop number i is increased by "1", to update the current value and the setting value of the reactive power Q (107).

On the other hand, when the loop continuous time is 0.1 second or more, the Q(gap) is slightly adjusted to shorten the loop continuous time (108).

In the calculating process, when the loop continuous time is the predetermined time (0.1 second in the embodiment) or more, the Q(gap) (predetermined reactive power) is slightly adjusted to shorten the loop continuous time.

The above slight adjustment is performed because the electric power becomes instable especially when the renewable energy power generation equipment 10 is coupled to the electric power grid 1; for the electric power generated by the renewable energy power generation equipment 10 is greatly affected by the environment (for example weather etc.) and the fluctuation of the electric power becomes large. Here, the slight adjustment is to modify the initial setting value of the Q(gap), regardless of the size of the modified value.

Then, the Q(gap) is replaced with the slightly-adjusted Q'(gap) (Q(gap)=Q'(gap)) and again the determination of the relational expression (1) is performed (109).

Figure 4:
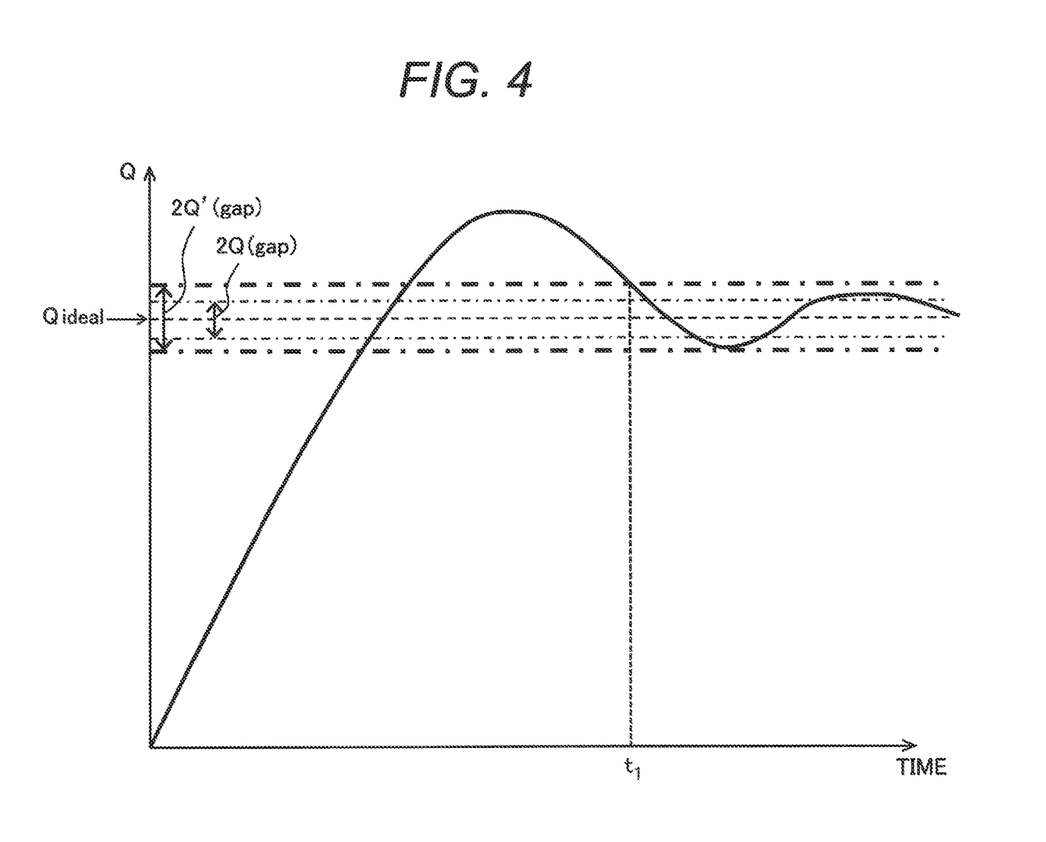
FIG. 4 is an explanatory view for describing slight adjustment of desired deviation of the reactive power according to the embodiment.

FIG. 4 is an explanatory view for describing the slight adjustment of a desired deviation of the reactive power according to the embodiment.

Here, the slight adjustment of the above desired deviation is described using FIG. 4. FIG. 4 shows a relation, for example, between the reactive power (Q) and the time (t), imaging that the reactive power (here, this is described as (reactive power Q)) on the left side of the relational expression (1) converges on the Q(ideal).

When the initial setting value is the Q(gap), the (reactive power Q) does not converge in the range of 2Q(gap) with the Q(ideal) set as the center at the time t1. On the other hand, when the initial setting value (initial value) is slightly adjusted to Q'(gap), the (reactive power Q) converges in the range of 2Q'(gap) with the Q(ideal) set as the center at the time t1.

As mentioned above, by slightly adjusting the initial setting value from Q(gap) to Q'(gap), it can be determined that the deviation value converges within the allowance at the time t1 and later.

According to the embodiment, from the viewpoint of controlling the reactive power Q, automatic adjustment of the Q(gap) as the deviation value from the targeted value can solve the waste of time required for the determination loop of algorithm caused by not converging on the Q(ideal) because of the unpredictable fluctuation.

Particularly, by automatically adjusting the Q(gap), in determination of the relation of (1), it is possible to solve a problem of wasting time more than the setting time (the loop continuous time) in the determination loop of algorithm caused by not converging on the Q(ideal) because of the unpredictable fluctuation of the renewal energy power generation equipment 10 unsteadily fluctuating.

Here, the setting time can be set to be shorter as the determination becomes severer and to be longer as the determination becomes looser.

For example, considering the case where the photovoltaic power generation and the wind power generation as the typical renewable energy power generation equipment 10 respectively supply the reactive power Qs(r, i) (photovoltaic) and the reactive power Qw(r, i) (wind power) to the grid side, the reactive power Qs(r, i) (photovoltaic) and the reactive power Qw(r, i) (wind power) are different in the electric generating power under a predetermined condition, and according to this, the Q(gap) to be preset (initially set) has to be adjusted.

Particularly, in the case of the photovoltaic power generation, the main conditional plan to affect the reactive power Qs(r, i) (proportional to solar insolation) includes time (hh hour mm minute), date (mm month dd day), weather (clear (cloud cover 0 to 10%), fair (cloud cover 20 to 80%), cloudy (cloud cover 90 to 100%), rain, snow, fog, and the like), place (regional difference in latitude and longitude), equipment specifications of the photovoltaic power generation (panel area, power generation efficiency, rated solar insolation, etc.), and the like.

For example, coefficients for correction according to the weather are classified, to adjust the gap through multiplication by a predetermined rate. As the adjustment coefficient plan, the latest weather information is obtained from a database of the Metrological Agency and the like in real time. For example, as the correction by (1) cloud cover, some amount×(100−cloud cover)% and as the correction by (2) rain, snow, and fog, some amount×50 (typical)% may be considered.

Particularly, in the case of the wind power generation, the main conditional plan to affect the reactive power Qw(r, i) (in the power generation equipment, the actually blowing wind affects the revolution per minute (RPM) of a wind turbine of the electric power generator) includes place (regional difference in latitude and longitude), date (mm month dd day) (generally, wind speed tends to be higher in winter and lower in summer), ground level (generally, wind speed tends to be higher according as the altitude gets higher and lower according as the altitude gets lower), equipment specifications of the wind power generation (installation number, rated wind speed, power generation efficiency, yaw control of windmill, presence or absence of the operating blade, etc.), and the like.

Then, coefficients for correction according to the oscillation factor are classified, hence to adjust the gap through multiplication by a predetermined average wind speed. For example, as the correction by (1) date (seasons), some amount×1.0 (spring/autumn), some amount×0.8 (summer), some amount×1.2 (winter) (typical) and as the correction by (2) yaw control of windmill and presence or absence of operating blade, some amount×cos θ (θ: angle made by wind speed vector and windmill rotation axis) may be considered.

In the above-mentioned embodiment, although the description has been made in the case of using a plurality of adjustment coefficients, a single (constant) adjustment coefficient may be used.

In other words, in the embodiment, a DB about the electric generating capacity of the renewable energy for the date and time in the past is provided, and predetermined reactive power is set based on the electric generating capacity stored in the above DB. Further, the predetermined reactive power is adjusted according to the adjustment coefficient (adjustment coefficient plan) based on the weather information in real time.

Further, by making the sampling time longer, generally a change of parameter can be loosened and plotted. Particularly, as for the parameter irregularly and rapidly changing like in the renewal energy power generation equipment 10, this method is effective in the sever determination like the relation of (1) in the vicinity of the boundary range of the Q(gap).

As mentioned above, by calculating the optimal reactive power Q(ideal) (k, i) and reactive power Q(ideal) (s, i) and outputting the above to the AVR11, AVR12, AVR13, and the synchronous condenser 3, to control the reactive power Q(1), the reactive power Q(2), the reactive power Q(3), and the reactive power Q(s), it is possible to stabilize the electric power grid 1 even when the renewable energy power generation equipment 10 having great fluctuation of the electric power is coupled to the electric power grid 1.

The invention is not restricted to the abovementioned embodiment but it includes various modified examples. For example, the abovementioned embodiment has been described in details for the sake of easy understanding of the invention and the invention is not necessarily restricted to the structure having all the described components.

LIST OF REFERENCE SIGNS

1: ELECTRIC POWER GRID
2: POWER CONSUMPTION AREA
3: SYNCHRONOUS CONDENSER
4: REACTIVE POWER CONTROL EQUIPMENT
5: DISPATCH CENTER
10: RENEWABLE ENERGY POWER GENERATION EQUIPMENT
11, 12, 13: AVR
15: RENEWABLE ENERGY POWER GENERATION EQUIPMENT INPUT DB
21, 22, 23: AVR INPUT DB
25: CONSUMPTION AREA INPUT DB
26: CONSUMPTION AREA OUTPUT DB
31, 32, 33: AVR OUTPUT DB
35: SYNCHRONOUS CONDENSER INPUT DB
36: SYNCHRONOUS CONDENSER OUTPUT DB
41: INPUT PORTION DB
42: CALCULATION UNIT
43: OUTPUT PORTION DB

What is claimed is:
1. Reactive power control equipment comprising:
an input portion that inputs information of reactive power including reactive power adjusted by an automatic voltage regulator of automatically adjusting a voltage of electric power generated by an electric power generator, reactive power adjusted by a synchronous condenser, reactive power of electric power generated by renewable energy power generation equipment, and reactive power set in a load terminal point of consuming the electric power;
a calculation unit that calculates each setting value of reactive power adjusted by the synchronous condenser and the automatic voltage regulator, using the information of the reactive power input in the input portion; and
an output portion that outputs the setting values of the reactive power calculated by the calculation unit respectively to the synchronous condenser and the automatic voltage regulator.
2. The equipment according to claim 1, wherein the calculation unit subtracts a total of the reactive power adjusted by the automatic voltage regulator, the reactive power adjusted by the synchronous condenser, and the reactive power of the electric power generated by the renewable energy power generation equipment, from the reactive power set in the load terminal point, to calculate a deviation value.
3. The equipment according to claim 2, wherein the calculation unit compares the deviation value with predetermined reactive power.
4. The equipment according to claim 3, wherein when the deviation value is the predetermined reactive power and more, the calculation unit determines whether or not a loop continuous time is a predetermined time and more.

5. The equipment according to claim 4, wherein when the loop continuous time is the predetermined time and more, the calculation unit adjusts the predetermined reactive power.

6. The equipment according to claim 3, wherein the predetermined reactive power is set based on electric generating capacity of renewable energy for date and time in the past.

7. The equipment according to claim 3, wherein the predetermined reactive power is adjusted by using an adjustment coefficient based on weather information in real time.

* * * * *